United States Patent
Landry et al.

(10) Patent No.: US 8,716,886 B2
(45) Date of Patent: May 6, 2014

(54) CIRCUIT DEVICE AND METHOD OF CURRENT LIMIT-BASED DISCONNECT DETECTION

(75) Inventors: D. Matthew Landry, Austin, TX (US); John Gammel, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 508 days.

(21) Appl. No.: 12/238,478

(22) Filed: Sep. 26, 2008

(65) Prior Publication Data

US 2010/0078992 A1 Apr. 1, 2010

(51) Int. Cl.
H02J 1/00 (2006.01)

(52) U.S. Cl.
USPC .......................................................... 307/35

(58) Field of Classification Search
USPC .......................................................... 307/35
See application file for complete search history.

(56) References Cited

U.S. PATENT DOCUMENTS

| | | | |
|---|---|---|---|
| 5,406,260 A | 4/1995 | Cummings et al. | 340/568 |
| 7,002,353 B1 | 2/2006 | Lo et al. | 324/534 |
| 7,248,097 B2 | 7/2007 | Montgomery | 327/538 |
| 7,299,368 B2 | 11/2007 | Peker et al. | 713/300 |
| 7,337,336 B2 | 2/2008 | Ferentz et al. | 713/300 |
| 7,355,416 B1 | 4/2008 | Darshan | 324/713 |
| 7,356,588 B2 | 4/2008 | Stineman, Jr. et al. | 709/224 |
| 7,368,798 B2 | 5/2008 | Camagna et al. | 257/499 |
| 7,373,528 B2 | 5/2008 | Schindler | 713/300 |
| 7,373,532 B2 | 5/2008 | Schindler | 713/300 |
| 2003/0146765 A1 | 8/2003 | Darshan et al. | |

(Continued)

OTHER PUBLICATIONS

PCT/US2009/058193, Notification of transmittal of the International Search Report and the Written Opinion, International Search Report, and Written Opinion of the International Searching Authority, mailed Oct. 12, 2009, 14 pages.

(Continued)

Primary Examiner — Stephen W Jackson
Assistant Examiner — Dru Parries
(74) Attorney, Agent, or Firm — Cesari & Reed LLP; R. Michael Reed

(57) ABSTRACT

In a particular embodiment, a power sourcing equipment (PSE) device includes at least one network port adapted to couple to a powered device to provide power and optionally data to the powered device via a network cable. The PSE device further includes a current limiter circuit coupled to the at least one network port and having an adjustable threshold. The PSE device also includes a logic circuit coupled to the current limiter circuit and adapted to reduce the adjustable threshold of the current limiter circuit to have a threshold level that is below a nominal operating current level. After a period of time has elapsed during which the current limiter circuit is not activated, the logic circuit is adapted to determine that the powered device is disconnected from the at least one network port.

21 Claims, 8 Drawing Sheets

(56) References Cited

U.S. PATENT DOCUMENTS

| | | | |
|---|---|---|---|
| 2006/0165096 A1 | 7/2006 | Heath et al. | |
| 2006/0166706 A1 | 7/2006 | Dwelley et al. | 455/572 |
| 2006/0181817 A1 | 8/2006 | Ohana et al. | 361/18 |
| 2006/0290208 A1 | 12/2006 | Chang et al. | 307/116 |
| 2007/0075586 A1 | 4/2007 | Bogue | 307/66 |
| 2007/0085653 A1* | 4/2007 | Shimizu et al. | 338/128 |
| 2007/0133238 A1 | 6/2007 | Herbold | 363/63 |
| 2007/0274322 A1 | 11/2007 | Hansalia | 370/395.53 |
| 2007/0283173 A1 | 12/2007 | Webb et al. | 713/300 |
| 2008/0080105 A1 | 4/2008 | Blaha et al. | |
| 2008/0098240 A1 | 4/2008 | Hussain et al. | 713/300 |
| 2008/0151457 A1 | 6/2008 | Apfel | 361/111 |
| 2008/0162973 A1 | 7/2008 | Landry et al. | 713/340 |

OTHER PUBLICATIONS

Maxim Integrated Products, MAX5945, "Quad Network Power Controller for Power-Over-LAN," 2005.

Darshan, Yair, PowerDsine, "IEEE 802.3af DTE Power via MDI: PSE Based Disconnect-Detection Alternative," Mar. 2002.

* cited by examiner

CIRCUIT DEVICE AND METHOD OF CURRENT LIMIT-BASED DISCONNECT DETECTION

FIELD

The present disclosure is generally related to a circuit device and method of current limit-based disconnect detection.

BACKGROUND

Power over Ethernet (PoE), which is outlined in IEEE Std 802.3-2005 clause 33 (the PoE Standard), refers to a technique for delivering power and data to an electronic device via Ethernet cabling. PoE eliminates the need for a separate power source to deliver power to attached powered devices. In a PoE system, a power sourcing equipment (PSE) device provides a power supply to electronic devices, which may be referred to as powered devices (PDs), via an Ethernet cable. Such PDs may include voice over Internet protocol (VoIP) telephones, wireless routers, security devices, network devices, field devices to monitor process control parameters, data processors, other devices, or any combination thereof.

The PSE device uses a PD detection operation to detect when a PD is coupled to a port of the PSE device, before the PSE device provides a power supply to the particular port. The PoE Standard also specifies that a PD that draws less than 10 mA of port current for a certain period of time is deemed to be disconnected, and the PSE device can discontinue the power supply to the particular port. Accordingly, PSE devices often monitor a current drawn by the PD using an analog-to-digital converter (ADC) circuit. However, such ADC circuits can be expensive and can be insensitive to current pulses of short duration, depending on the sampling rate of the ADC circuit, which current pulses may be drawn by the PD.

Hence, there is a need for circuitry to detect when a PD is disconnected from a port. Embodiments disclosed herein can provide solutions to these and other problems, and offer other advantages over the prior art.

SUMMARY

In a particular embodiment, a power sourcing equipment (PSE) device includes at least one network port adapted to couple to a powered device to provide power and optionally data to the powered device via a network cable. The PSE device further includes a current limiter circuit coupled to the at least one network port and having an adjustable threshold. The PSE device also includes a logic circuit coupled to the current limiter circuit and adapted to reduce the adjustable threshold of the current limiter circuit to have a threshold level that is below a nominal operating current level. After a period of time has elapsed during which the current limiter circuit is not activated, the logic circuit is adapted to determine that the powered device is disconnected from the at least one network port.

In a particular embodiment, the logic circuit is further adapted to detect when the current limiter circuit is activated to limit a port current and is adapted to increase the adjustable threshold to an operating current level associated with the powered device in response to detecting activation of the current limiter circuit.

DETAILED DESCRIPTION OF ILLUSTRATIVE EMBODIMENTS

A circuit device is disclosed that includes an analog current limiter circuit to detect when a powered device (PD) is disconnected. In a particular example, the analog current limiter circuit includes an adjustable current limit that can be set to a threshold level that is below a minimum port current specified by the PoE Standard. If the port current to a particular port that is coupled to the PD is higher than the threshold level for any period of time, the analog current limiter circuit is activated, indicating that the PD is still connected. The circuit device further includes logic to detect when the analog current limiter circuit is activated and to increase the threshold level to a nominal operating current level for the PD in response to detection of the activation. If the analog current limiter circuit is not activated after a period of time has elapsed, the logic can determine that the PD has been disconnected and can discontinue power to the associated port.

Figure 1:
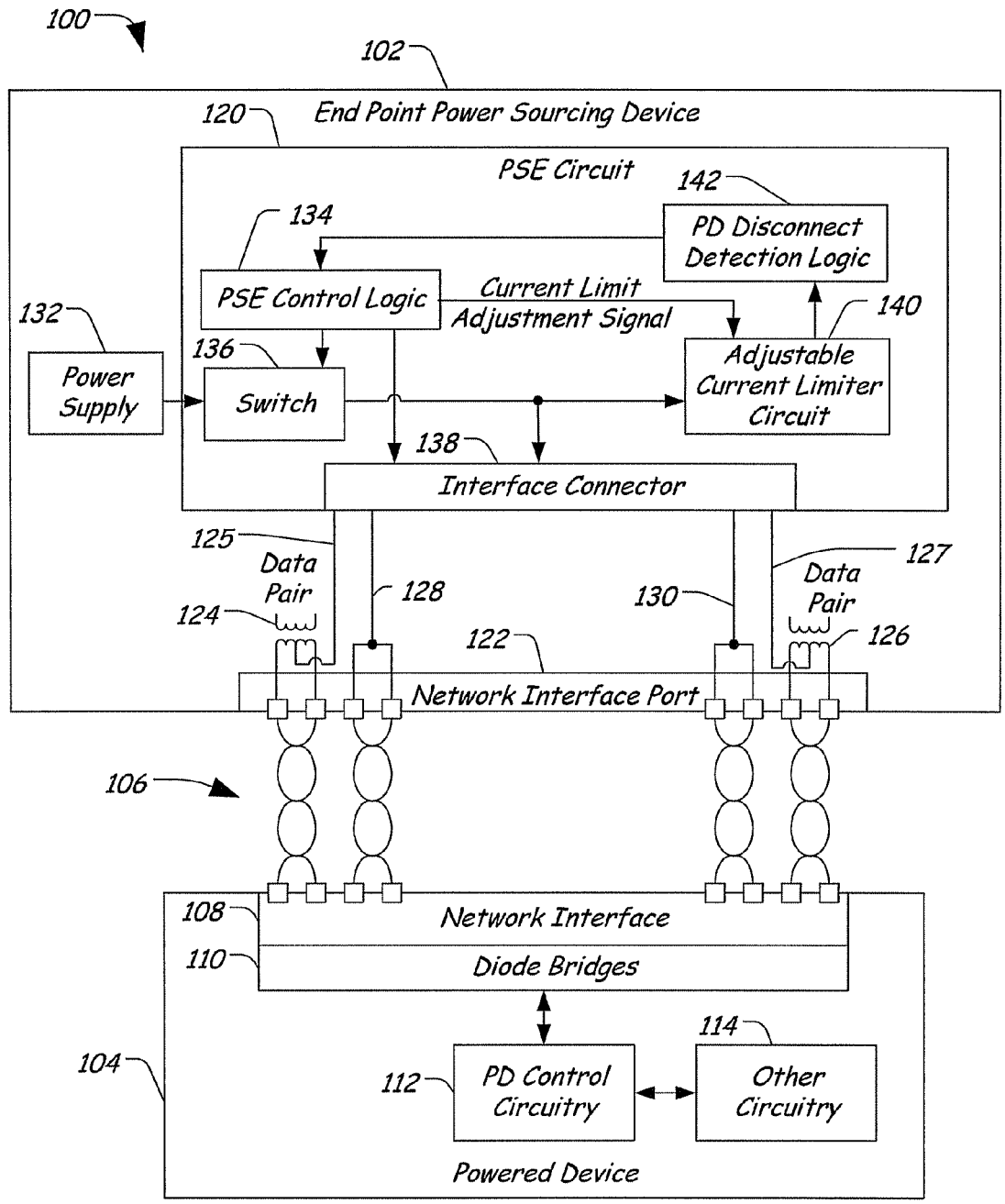
FIG. 1 is a block diagram of a particular illustrative embodiment of a Power over Ethernet (PoE) system including a power sourcing equipment (PSE) device with powered device (PD) disconnect detection logic.

FIG. 1 is a block diagram of a particular illustrative embodiment of a Power over Ethernet (PoE) system 100 including a power sourcing equipment (PSE) device 102 with powered device (PD) disconnect detection logic 142 and an adjustable current limiter circuit 140. The PSE device 102 is adapted to deliver power and data to a powered device (PD) 104 via a network cable 106, which can be a twisted-pair Ethernet cable including multiple wire pairs.

The PD 104 includes a network interface 108 that is adapted to couple to the network cable 106. The PD 104 further includes one or more diode bridges 110 to rectify a power supply received from the network cable 106 via the network interface 108. The PD 104 also includes PD control circuitry 112, which is coupled to the one or more diode bridges 110 to receive a power supply. The PD control circuitry 112 can include powered device detection and classification logic to control operation of the PD 104, during PoE detection and classification operations. Further, the PD control circuitry 112 can include a switched power regulator to control delivery of a power supply to other circuitry 114.

The PSE device 102 includes a PSE circuit 120 that is coupled to at least one network interface port, such as the network interface port 122, which is coupled to the PD 104 via the network cable 106. The PSE circuit 120 is coupled to the center taps of transformers 124 and 126 via lines 125 and 127, respectively. Further, the PSE circuit 120 can be coupled to other wire pairs of the network cable 106 via lines 128 and 130. It should be understood that coupling via transformer center taps such as the center taps of the transformers 124 and 126 and directly through wires 128 and 130 are not the only methods that can be used by a PSE to couple power to a network interface. The PSE circuit 120 includes PSE control logic 134 that is adapted to control a switch 136 to selectively couple a power supply 132 to at least one of the lines 125, 127, 128, and 130 via an interface connector 138. The PSE circuit 120 also includes the adjustable current limiter circuit 140 that is coupled to the switch 136 to receive a port current ($I_{PORT}$). The adjustable current limiter circuit 140 is adapted to limit the port current ($I_{PORT}$) to a level that is below a nominal operating current level and to generate an output signal when the adjustable current limiter circuit 140 is activated to limit the port current ($I_{PORT}$). The adjustable current limiter circuit 140 is coupled to PD disconnect detection logic 142 to detect the signal when the adjustable current limiter circuit 140 is activated. The PD disconnect detection logic 142 is coupled to the PSE control logic 134 to communicate an activation signal indicating that the adjustable current limiter circuit 140 has been activated. The PSE control logic 134 is adapted to increase the current limit threshold of the adjustable current limiter circuit 140 in response to receiving the activation signal.

In a particular embodiment, the PSE control logic 134 sends a current limit adjustment signal to the adjustable current limiter circuit 140, which signal reduces a current limit threshold associated with the adjustable current limiter circuit 140 to a current level that is below a nominal connection current level. In a particular example, the current limit threshold of the adjustable current limiter circuit 140 may be reduced to approximately 7.5 mA, which is below a minimum current level required by the PoE Standard. In a particular illustrative embodiment, the PSE control logic 134 can produce a reference current, which can be used as the current limit adjustment signal. In this particular example, by altering the reference current level, the current limit threshold of the adjustable current limiter circuit 140 can be changed. In another particular illustrative embodiment, the PSE control logic 134 can produce one or more current sense adjustment signals to selectively adjust one or more sections of a current sense circuit, thereby altering a current limit threshold of the adjustable current limiter circuit 140.

After the current limit threshold of the adjustable current limiter circuit 140 is reduced, the PD disconnect detection logic 142 monitors the adjustable current limiter circuit 140. If the port current reaches the current limit threshold, the adjustable current limiter circuit 140 is activated to limit the port current, which activation is detected by the PD disconnect detection logic 142 to determine that the PD 104 is still connected. The PD disconnect detection logic 142 provides a signal to the PSE control logic 134 indicating that the PD 104 is still connected. In response to receiving the signal indicating that the PD 104 is still connected, the PSE control logic 134 provides a current limit adjustment signal to the adjustable current limiter circuit 140 to increase the current limit threshold to a current level that is at or above an operating current level of the PD 104. In a particular example, the operating current level of the PD 104 may be related to a determined power classification associated with the PD 104 during a PoE power classification operation.

Figure 2:
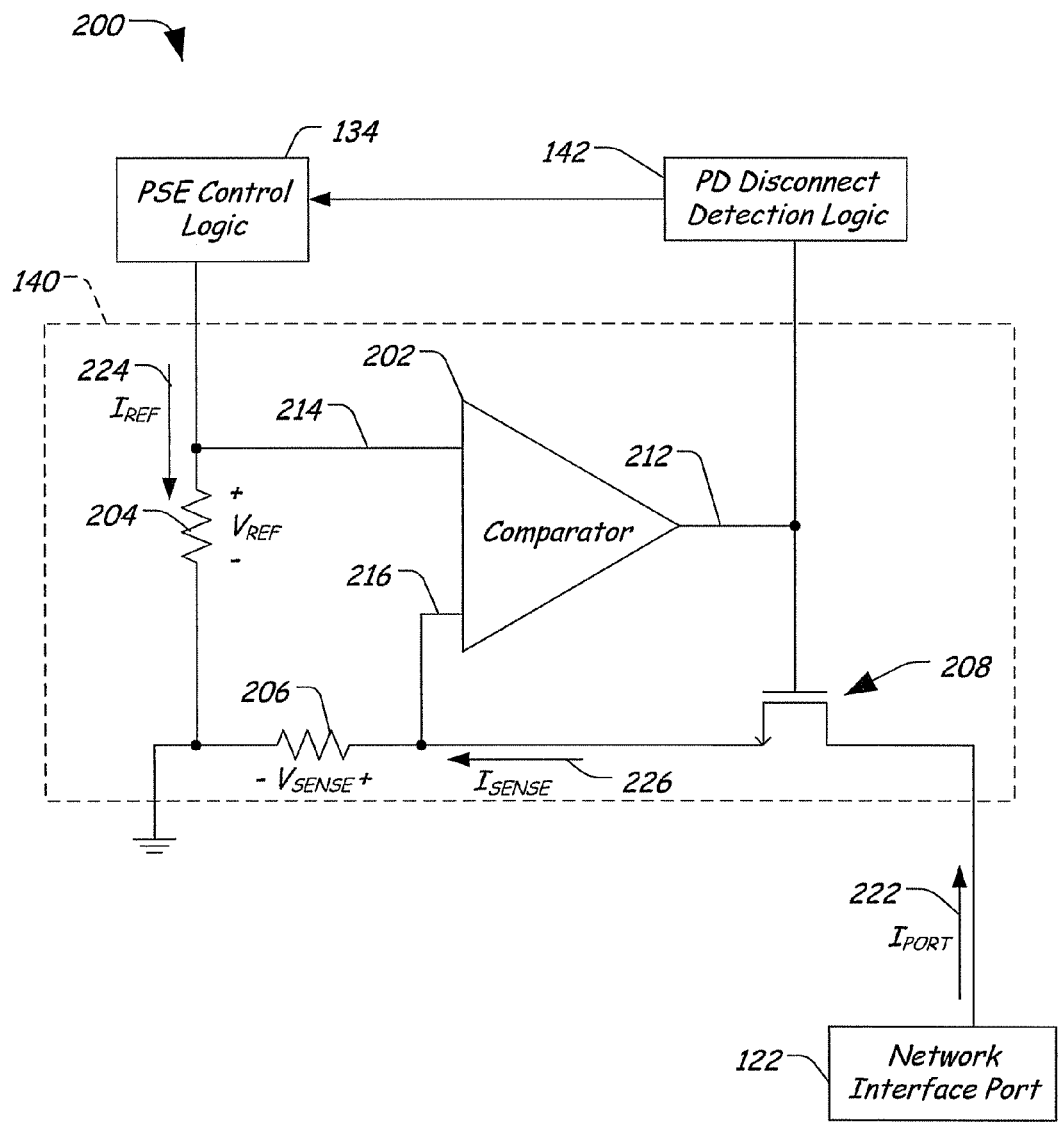
FIG. 2 is a diagram of a particular illustrative embodiment of a circuit device including an adjustable current limiter circuit to detect disconnection of a powered device from a network interface port.

FIG. 2 is a diagram of a particular illustrative embodiment of a circuit device 200 including PD disconnect detection logic 142 and an adjustable current limiter circuit 140. The circuit device 200 includes the PSE control logic 134 coupled to the adjustable current limiter circuit 140, which is coupled to the PD disconnect detection logic 142 and to the network interface port 122. The adjustable current limiter circuit 140 is adapted to receive a reference current ($I_{REF}$) 224 from the PSE control logic 134 and to receive a port current ($I_{PORT}$) 226 from the network interface port 122 via a port switch 208.

The adjustable current limiter circuit 140 includes a comparator circuit 202 that is coupled to a reference resistor 204 and a sense resistor 206 via first and second inputs 214 and 216, respectively. The comparator circuit 202 includes an output 212 that is coupled to a control terminal of the port switch 208, which includes a first terminal coupled to the network interface port 122 and a second terminal coupled to the sense resistor 206. The sense resistor 206 is coupled between the second terminal of the port switch 208 and a voltage source, such as an electrical ground. The PD disconnection detection logic 142 may be coupled to the output 212 of the comparator circuit 202. Further, the PD disconnect detection logic 142 is coupled to the PSE control logic 134 to provide a signal related to a connection status of a powered device coupled to the network interface port 122.

In a particular embodiment, the adjustable current limiter circuit 140 is activated when a reference voltage ($V_{REF}$) at the reference input 214 is less than a sense voltage ($V_{SENSE}$) at the sense input 216. The sense voltage ($V_{SENSE}$) is associated with a sense current ($I_{SENSE}$) 226, which is related to the port current ($I_{PORT}$) 222. In this instance, activation of the adjustable current limiter circuit 140 adjusts the control terminal of the port switch 208. In particular, a voltage at the output 212 of the comparator 202 decreases, limiting the current passing through the port switch 208. A signal is generated that can be detected at the PD disconnect detection logic 142, which can detect that the adjustable current limiter circuit 140 has been activated and which can provide a signal to the PSE control logic 134 related to such activation. The PSE control logic 134 is adapted to increase the reference current ($I_{REF}$) 224 to adjust the threshold current level of the adjustable current limiter circuit 140 to a level that is greater than or equal to a nominal operating current level of the PD. Once the reference voltage ($V_{REF}$) increases above the sense voltage ($V_{SENSE}$), the voltage at the output 212 of the comparator 212 increases, turning on the port switch 208. In a particular embodiment, the nominal operating current level may be determined from a PoE power classification that is related to the PD.

In a particular illustrative example, the PoE Standard allows a range of currents to determine whether the PD has been disconnected from the network interface port 122. Under the current standard, in response to a current of more than 10 mA, the PSE device is to determine that the PD is connected to a port and to continue to provide power to the port. In response to a current of less than 5 mA, the PSE device is to determine that the PD is no longer connected to the port and to discontinue power to the port. Under the standard, a current of less than 10 mA and greater than 5 mA is within a decision region that is left to the manufacturer to determine. In this particular example, the circuit device 200 provides analog circuitry that can detect port currents at any number of current levels by adjusting the reference current ($I_{REF}$) 224. Further, since the circuit device 200 does not sample the port current 222, any pulse that exceeds the threshold current can trigger the adjustable current limiter circuit 140 to indicate that the PD is still connected to the network interface port 122. In a particular illustrative, non-limiting example, the nominal current limit can be 425 mA. In another particular illustrative embodiment, for the revised PoE Standard, which is sometimes referred to as the PoE Plus Standard, the nominal current limit for a PoE plus-enabled PD is approximately 720 mA. In another particular embodiment, the nominal operating current can be at a different current level, depending on the particular embodiment, the particular operating conditions, the particular standard, or any combination thereof.

A particular advantage provided by the adjustable current limiter circuit 140 is that a PSE device that includes the circuit device 200 can support PDs that utilize different power schemes. In a particular example, a PD can operate on a pulsed power supply (e.g., current pulse of short duration). In such an instance, the PD may utilize less power than would be consumed by a continuous power supply, and the PSE device can be adapted to continue to supply power to the network interface port. In a particular example, the PSE control logic 134 can apply a reference current ($I_{REF}$) that to reduce a current threshold of the adjustable current limiter circuit 140 to approximately 7.5 mA for a period of time and can determine that the PD is connected to the network interface port 122 provided that the port current exceeds 7.5 mA at any point during the period of time, allowing for sparse pulses of short duration. In a particular embodiment, the adjustable current limiter circuit 140 can be made to be very accurate by using small sense resistors and by resistor matching. Resistor matching between the reference resistor 204 and the sense resistor 206 allows a precise resistance ratio to be set. By setting the resistance ratio between the reference resistor 204 and the sense resistor 206, the sense resistor 206 can have a small resistance, and a small reference current ($I_{REF}$) 224 can be used, which small resistance and small reference current can reduce overall power consumption.

In a particular example, a ratio between the sense resistor 206 and the reference resistor 204 can be determined according to the following equation:

$$\frac{R_{SENSE}}{R_{REF}} = \frac{I_{REF}}{I_{SENSE}} \quad \text{(Equation 1)}$$

In a particular example, the sense current ($I_{SENSE}$) 226 can be approximately 10 mA, the sense resistor can be approximately 100 mΩ, and the reference current can be approximately 10 μA. Plugging these values into Equation 1, the reference resistor 204 can be determined as follows:

$$\frac{100 \text{ m}\Omega}{R_{REF}} = \frac{10 \text{ μA}}{10 \text{ mA}} = 100 \text{ }\Omega \quad \text{(Equation 2)}$$

It should be understood that the ratio of the sense resistor ($R_{SENSE}$) 206 to the reference resistor ($R_{REF}$) 204 is more important than the actual resistance values. The absolute resistance values can vary greatly with manufacturing reliability, but the ratio generally does not. Additionally, by controlling the reference current ($I_{REF}$) 224 on the circuit device 300, the sense current ($I_{SENSE}$) 226 can be compared with precision. Resistor matching can easily achieve plus or minus one percent (1%) tolerance, which is accurate enough for disconnect detection under the current version and pending versions of the PoE Standard or the PoE Plus Standard. However, more precise resistors can also be used, which can improve the matching tolerance and the precision, depending on the particular implementation. Furthermore, similar ratio-based integrated circuit topologies can accomplish a similar matching-tolerance dependent behavior, such as transistor matching structures and other integrated circuit device matching structures.

In a particular example, since the PoE Standard specifies that a 10 mA port current ($I_{PORT}$) 222 represents a connected PD and a port current ($I_{PORT}$) 222 that is less than 5 mA represents a disconnected PD, the PSE control logic 134 can apply a reference current ($I_{REF}$) 224 that triggers current limiting in response to a port current of 7.5 mA. With this reference, a port current 222 of 5 mA or less would not trigger activation of the current limiter circuit 140 and a port current 222 of 10 mA would trigger activation of the current limiter circuit 140, thereby indicating that the PD is connected.

Figure 3:
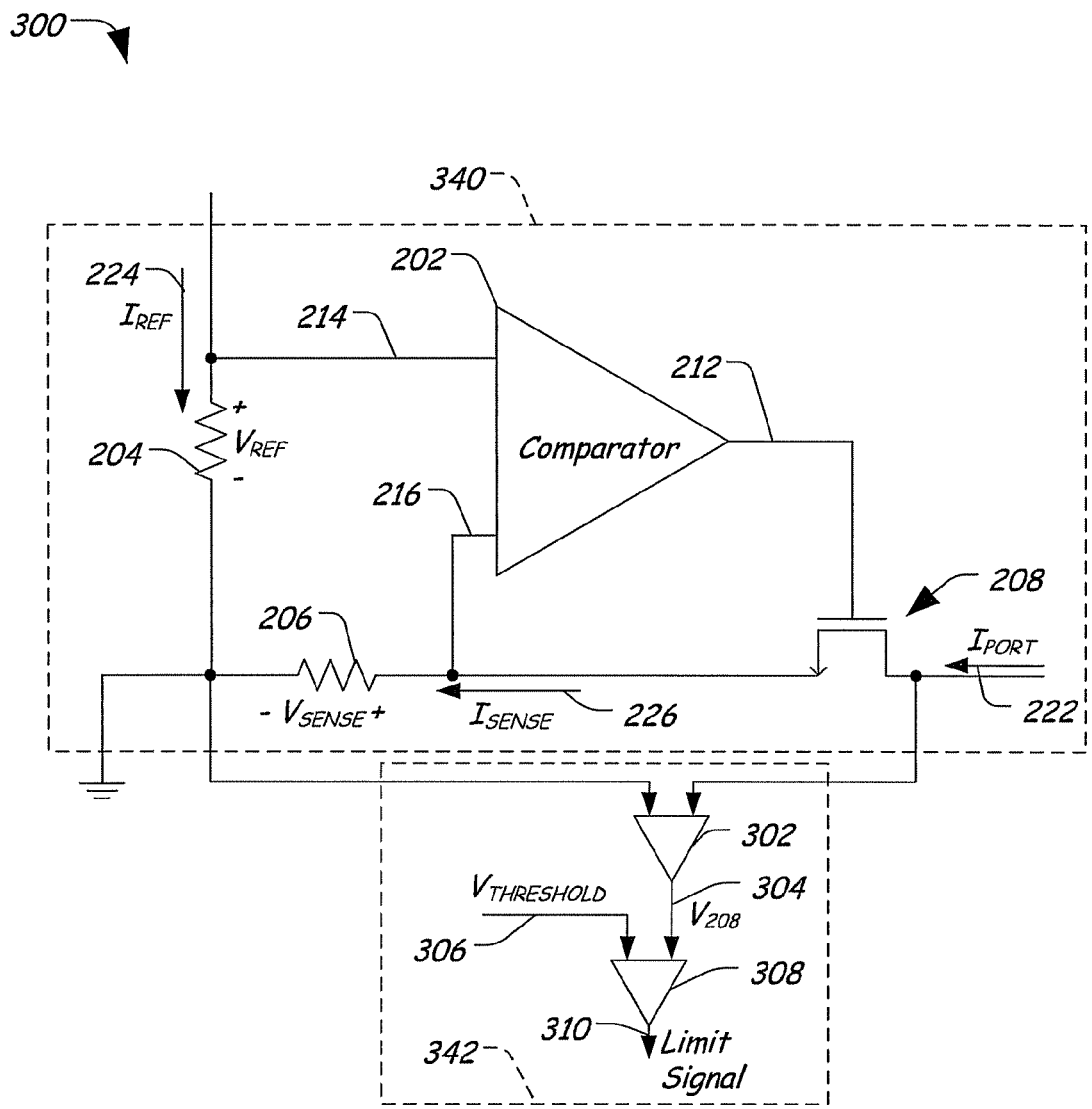
FIG. 3 is a diagram of a second particular illustrative embodiment of a circuit device including an adjustable current limiter circuit to detect disconnection of a powered device from a network interface port.

FIG. 3 is a diagram of a second particular illustrative embodiment of a circuit device 300 that includes disconnect detection logic 342 and an adjustable current limiter circuit 340. The adjustable current limiter circuit 340 includes the comparator 202 that has a first input 214 coupled to a reference resistor 204 and a second input 216 coupled to a sense resistor 206. The comparator 202 is adapted to compare a reference voltage ($V_{REF}$) to a sense voltage ($V_{SENSE}$) and to produce a value at the output 212 that is related to the comparison. The output 212 is coupled to a control terminal of a port switch 208, which includes first terminal coupled to a network interface port, such as the network interface port 122, and includes a second terminal coupled to the sense resistor 206.

The disconnect detection logic 342 includes a second comparator 302 to compare a voltage across the port switch 208 to a voltage threshold ($V_{THRESHOLD}$) 306. In particular, the second comparator 302 receives a first voltage at the first terminal of the port switch 208 and receives a power supply voltage (such as an electrical ground) and compares them to produce a voltage signal ($V_{208}$) at a first input 304 of a third comparator 308. The third comparator 308 compares the threshold voltage ($V_{THRESHOLD}$) 306 to the voltage signal ($V_{208}$) at the first input 304 to produce a limit signal at the output 310, which indicates whether the adjustable current limiter circuit 340 has been activated.

In a particular example, if the reference voltage is greater than the sense voltage, the voltage at the output 212 is high, holding the port switch 208 active to allow the port current ($I_{PORT}$) to flow across the port switch 208. In a particular embodiment, where the PSE device is referenced to a negative voltage, a voltage at the drain of the port switch 208 can be at or near the negative power supply rail. However, if the reference voltage is less than the sense voltage, the voltage at the output 212 decreases, turning off the port switch 208. In this instance, the voltage at the first terminal (drain) of the port switch 208 increases, increasing a magnitude of the voltage signal ($V_{208}$) at the first input 304 of the third comparator 308. Thus, the PD disconnect detection logic 342 is adapted to detect when the port switch 208 is turned off, indicating that the PD remains connected to the network interface port 122. If, after a period of time has elapsed, the disconnect detection logic 342 does not detect that the port switch 208 is turned off, the disconnect detection logic 342 can provide a "NO LIMIT" signal or another indicator to a PSE control circuit to deactivate a power supply to the network interface port.

In a particular embodiment, the PSE control circuit can include the disconnect detection logic 342. In another particular embodiment, the PSE control circuit can be replaced with another type of control circuit.

Figure 4:
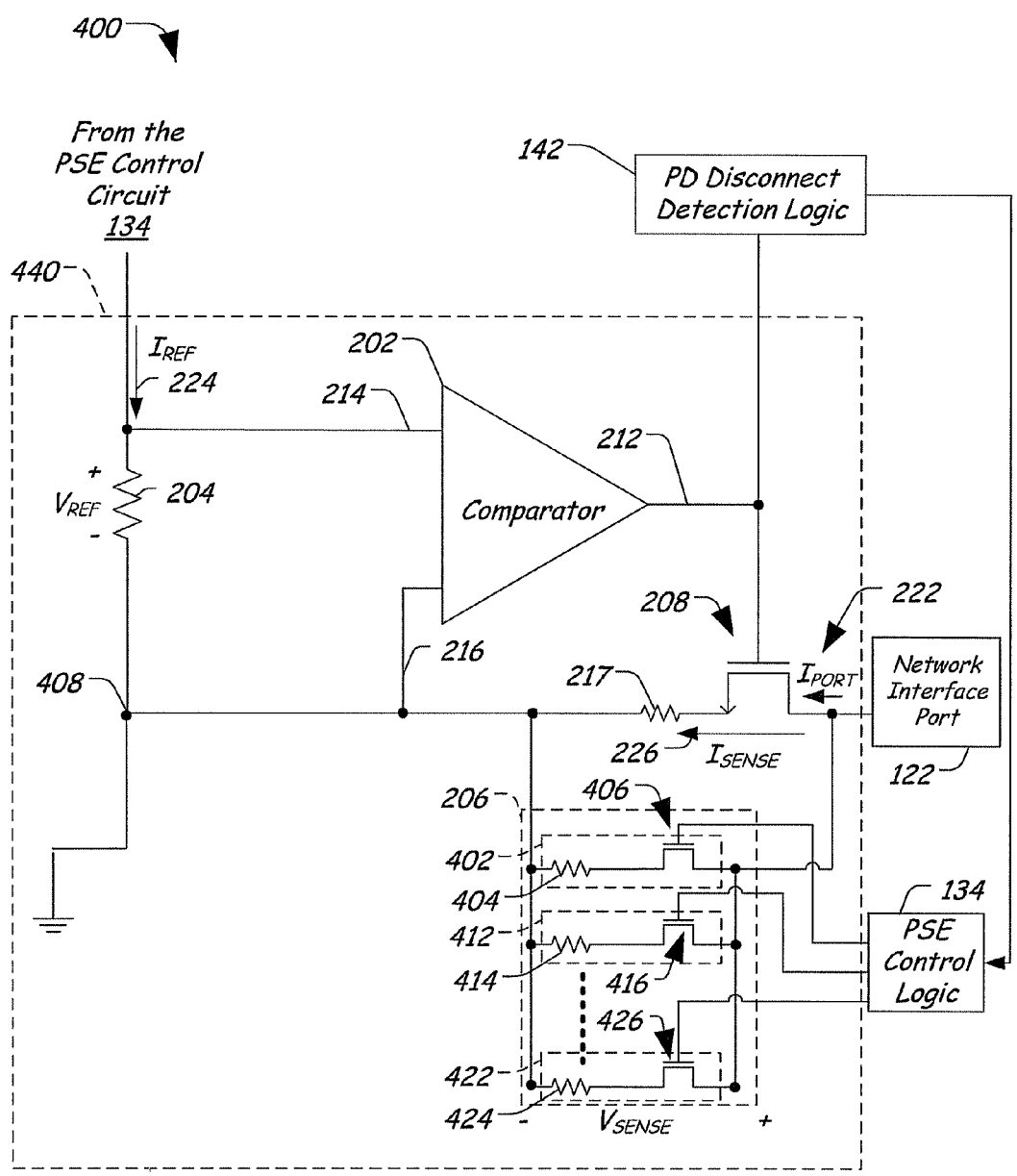
FIG. 4 is a diagram of a third particular illustrative embodiment of a circuit device including disconnect detection logic and an adjustable current limiter circuit to detect disconnection of a powered device from a network interface port.

FIG. 4 is a diagram of a third particular illustrative embodiment of a circuit device 400 including disconnect detection logic 142 and an adjustable current limiter circuit 440. The adjustable current limiter circuit 440 is coupled to the network interface port 122 to receive the port voltage ($I_{PORT}$) 222 and to the PSE control logic 134 to receive the reference current ($I_{REF}$) 224. The adjustable current limiter circuit 440 further includes the comparator 202 including a reference input 214 coupled to a reference resistor 204 and including a sense input 216 coupled to a sense resistor circuit 206. The output 212 of the comparator 202 is coupled to the disconnect detection logic 142 and to a control terminal of the port switch 208, which includes a first terminal coupled to the network interface port 122 and a second terminal coupled to the sense resistor circuit 206.

In this particular embodiment, the sense resistor circuit 206 can be a switchable array of resistors which can be controlled by a control circuit, such as the PSE control logic 134 to alter an effective resistance of the sense resistor circuit 206. In a particular example, the sense resistor circuit 206 includes a first resistor circuit 402, a second resistor circuit 412, and an n-th resistor circuit 422, which are coupled in parallel with the port switch 208. It should be understood that while only three resistor circuits 402, 412, and 422 are shown, the sense resistor circuit 206 can include any number of resistor circuits to provide a desired level of granularity with respect to the adjustable resistances.

In this particular example, the first resistor circuit 402 includes a first resistor 404 having a first terminal coupled to the second input 216 and a second terminal coupled to a first terminal of a first switch 406. The first switch 406 includes a control terminal coupled to the PSE control logic 134 and a second terminal coupled to the network interface port 122. The node 408 is coupled to a voltage supply, such as an electrical ground. The second resistor circuit 412 includes a second resistor 414 having a first terminal coupled to the second input 216 and a second terminal coupled to a first terminal of a second switch 416. The second switch 416 includes a control terminal coupled to the PSE control logic 134 and a second terminal coupled to the network interface port 122. The n-th resistor circuit 422 includes an n-th resistor 424 having a first terminal coupled to the second input 216 and a second terminal coupled to a first terminal of an n-th switch 426. The n-th switch 426 includes a control terminal coupled to the PSE control logic 134 and a second terminal coupled to the network interface port 122. In this particular example, the switches 406, 416, and 426 can be referred to a sense switches and the resistors 404, 414, and 424 can be sense resistors.

In this particular embodiment, the PSE control logic 134 can be adapted to adjust both a reference current ($I_{REF}$) 224 to alter a reference voltage and to adjust an effective sense resistance to alter a sense voltage. In a particular embodiment, the PSE control logic 134 can provide an unchanging reference current and can vary the effective sense resistance by selectively disconnecting the resistor circuits 402, 412, or 414 from the sense resistor array circuit 206. Further, the PSE control logic 134 is adapted to selectively activate or deactivate the switches 406, 416, and 426 to selectively couple or decouple the resistor circuits 402, 412, and 422 in parallel to adjust an effective resistance of the sense resistor circuit 206 and of the overall sense resistance. In a particular embodiment, the resistors 404, 414, and 424 can be omitted and the sense resistance can be provided by the switches 208, 406, 416, and 426 themselves. Alternatively, a small sense resistance can be provided at 217 in parallel with the sense resistor circuit 206 to provide an adjustable effective sense resistance.

In this particular example, the sense resistor circuit 206 can be an array of small transistors and resistors, which can aggregate to add up to a single large transistor and a single effective sense resistance. Since the resistors 404, 414, and 424 can be coupled in parallel, a single resistor 404 have a greater resistance than the multiple resistors in parallel. The PSE control logic 134 can control the resistor circuits 402, 412, and 422 to selectively turn on or off particular resistor circuits. By turning off the resistor circuits 412 and 422, the sense resistance is increased, effectively raising the value of the sense resistor circuit 206. If the resistance value is higher, the current limit is decreased. It should be clear that an increased sense resistance increases a sense voltage ($V_{SENSE}$) across the sense resistor circuit 206 and alters the ratio of the reference resistor 204 to the sense resistor circuit 206, which changes the current limit. In a particular example, the resistance can be adjusted based solely on the switch resistance, and the discrete resistors 404, 414, 424 and 217 can be omitted.

In another particular example, the sense resistor circuit 206 can be adjusted by shutting off all but one of the resistor circuits 402, 412, and 422 to increase the sense resistance. Increasing the sense resistance allows the current limit to be changed without sacrificing higher sense voltage ($V_{SENSE}$) values. During operation, a nominal current limit for a PD that is enabled for operation under the PoE Standard should be approximately 425 mA. For the revised PoE Standard, which is sometimes referred to as the PoE Plus Standard, the nominal current limit for a PoE plus-enabled PD is approximately 720 mA. By adjusting the current limit of the adjustable current limiter circuits 140, 340, and 440, illustrated in FIGS. 1-4, the PD disconnect detection logic 142 can detect the presence or absence of the PD by checking if the adjustable current limiter circuit has current limited or not.

Figure 5A:
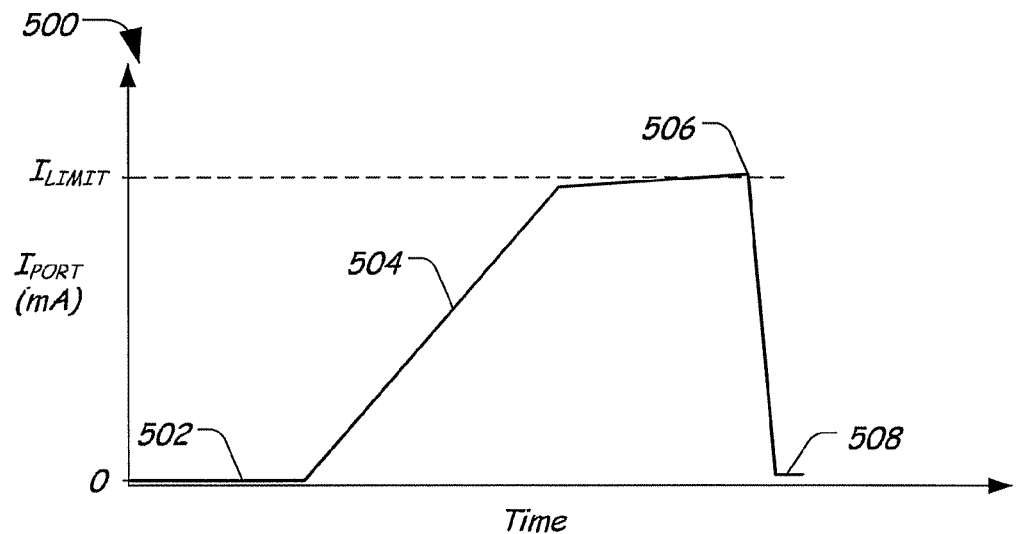
FIGS. 5A and 5B are graphs of a port current ($I_{PORT}$) and a port voltage ($V_{PORT}$) versus time for a particular embodiment of a circuit device including the adjustable current limiter circuit.
Figure 5B:
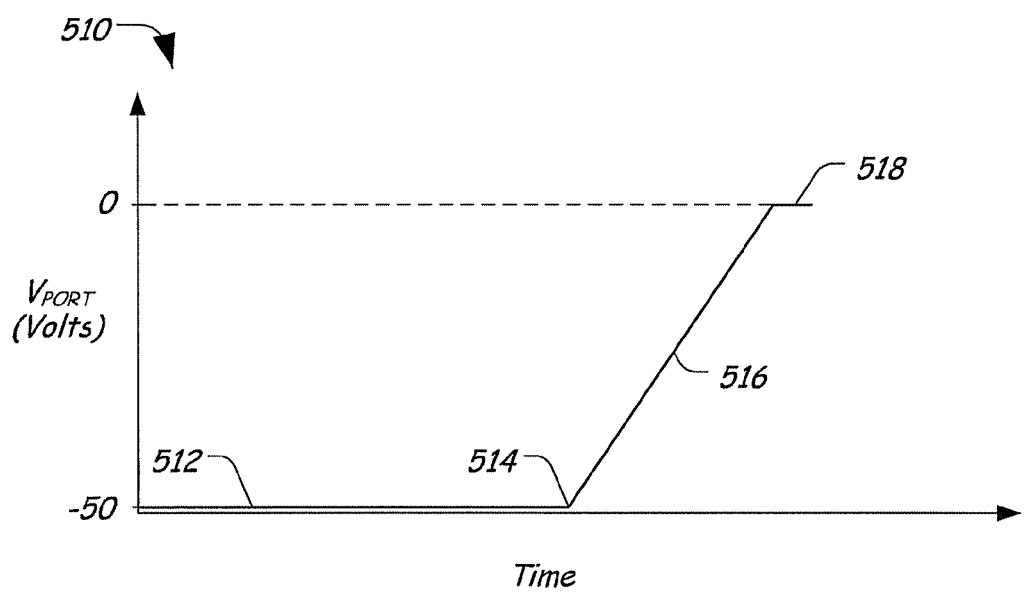

FIGS. 5A and 5B are graphs 500 and 510, respectively, of a port current ($I_{PORT}$) and a port voltage ($V_{PORT}$) versus time for a particular embodiment of a circuit device including disconnect detection logic and an adjustable current limiter circuit when the current limiter circuit is activated. Referring to FIG. 5A, the graph 500 shows (at 504) that the current increases from 502 to a current limit and is held constant at the current limit ($I_{LIMIT}$). At 506, the port current ($I_{PORT}$) decreases to 508.

Turning to FIG. 5B, the graph 510 illustrates the negatively referenced voltage at the interface port, which increases (at 514) from −50 volts (at 512) to 0 volts or ground (at 518), which increase corresponds to the port current ($I_{PORT}$) being limited (as illustrated in FIG. 5A.

In a particular example, if the current limit of the adjustable current limiter circuit is set to approximately 7.5 mA, a 10 mA current draw of a valid PD will result in the voltage across the FET rising to ground. This rising voltage indicates that a valid PD is present. However, if the current limit condition continues, the PD will eventually be shut down when the port voltage collapses too much. The PD disconnect detection logic is adapted to detect the presence of the PD and to provide a signal to the PSE control logic, which can increase the threshold current level of the adjustable current limiter circuit. Referring to FIG. 4, the full resistor and/or transistor array can be enabled to increase the threshold current level. Alternatively, referring to FIGS. 1-3, the reference current ($I_{REF}$) can be increased to increase the threshold current level.

Figure 6A:
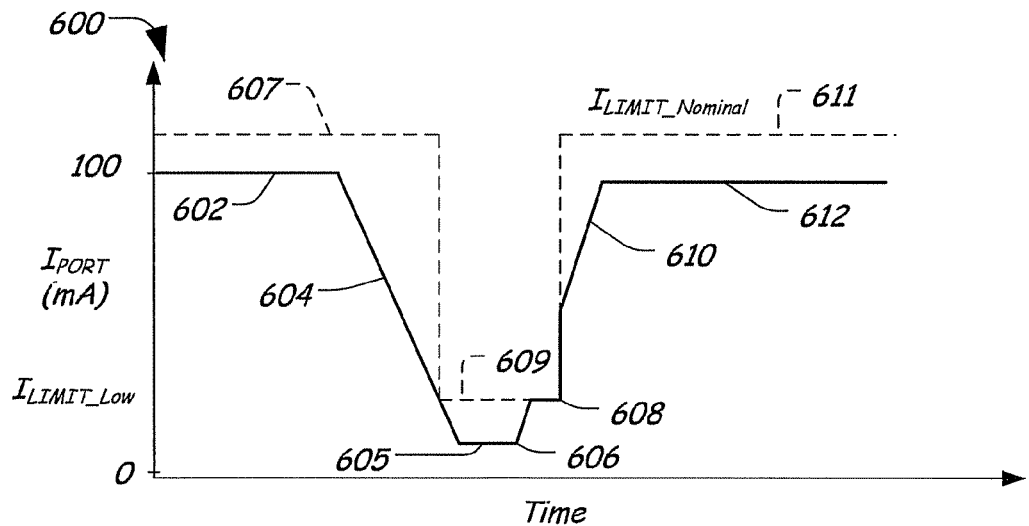
FIGS. 6A and 6B are graphs of a port current ($I_{PORT}$) and a port voltage ($V_{PORT}$) versus time for a particular embodiment of a circuit device including the adjustable current limiter circuit.
Figure 6B:
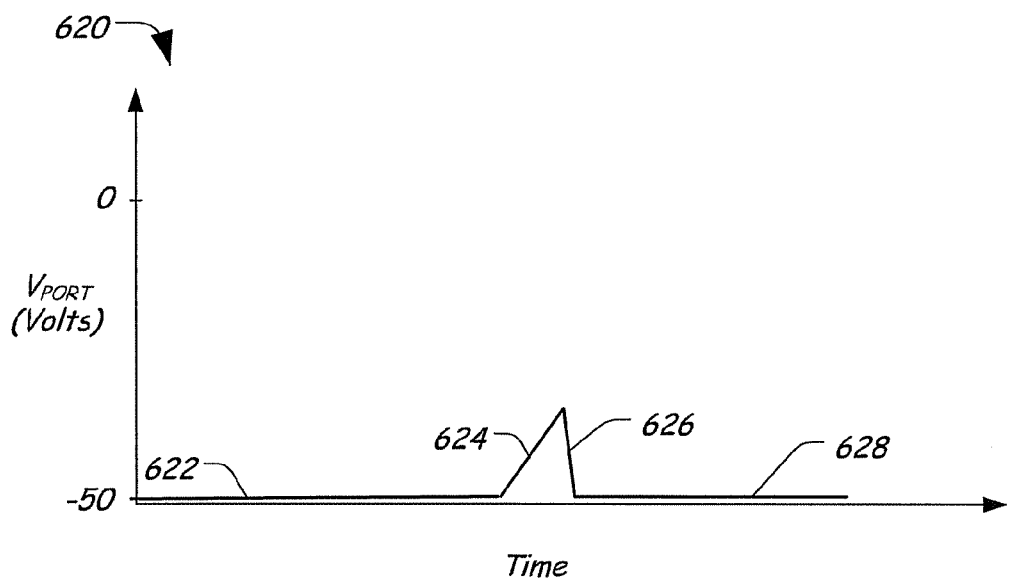

FIGS. 6A and 6B are graphs of a port current ($I_{PORT}$) and a port voltage ($V_{PORT}$) versus time for a particular embodiment of a circuit device including disconnect detection logic. In the embodiment shown, the graph 600 illustrates the port current at a first current level 602. The port current level decreases (at 604) from the first current level 602 to a second current level

605. The graph 600 also shows a nominal current limit 607, which may be higher than a nominal operating current, such as the first current level 602.

The second current level 605 is below a low current threshold level of the adjustable current limiter circuit, and the current limit of the adjustable current limiter can be reduced to a low current level ($I_{LIMIT\_Low}$) at 609. At 606, the port current increases to the low current level ($I_{LIMIT\_Low}$) 609, tripping the current limiter circuit to limit the port current at 608. In response to detecting the activation of the current limiter circuit at 608, the current limit threshold is adjusted to the nominal operating current level ($I_{LIMIT\_Nominal}$) at 611, and the port current is allowed to increase, such as generally indicated at 610 to a nominal current level 612.

Referring to 6B, the graph 620 illustrates a port voltage at a first voltage level 622. The port voltage begins increasing at 614 when the port current is limited by the adjustable current limiter circuit. When the current limit threshold is adjusted or removed to allow the port current to increase to the first current level (at 608 in FIG. 6A), the port voltage (at 626 in FIG. 6B) decreases and returns to the first voltage level (at 628). This voltage transient reflects current flow at the interface port. In a particular instance, where the device is referenced to a positive polarity, the port voltage may be inverted with respect to the graph 610 illustrated in FIG. 6B.

In the example illustrated in FIG. 6B, the port voltage illustrated by the graph 620 (at 624 and 626) represents a transient pulse or signal that can be measured at the network interface port when a valid PD is present and that can be detected by the PD disconnect detection logic to detect the presence of a PD at the network interface port. In a particular, non-limiting embodiment, to limit transients at the network interface port, the adjustable current limiter circuit can be engaged only when the port current has already been measured to be quite low.

In a particular embodiment, the PSE control circuit can be used to periodically adjust the current limiter circuit to a current threshold level that is below a nominal operating current level and to reset the current limiter circuit to a higher current threshold level if the PD device is determined to be connected based on activation of the current limiter circuit. If the current limiter circuit is not activated during a period of time, the PSE control circuit can reduce the current threshold further, to see if the PD has been disconnected. In another particular embodiment, the PSE control circuit can adjust the current threshold of the current limiter circuit when a measured port voltage falls below an initial threshold. In still another particular embodiment, the PSE control circuit can adjust the current threshold aperiodically or randomly to test whether the PD remains connected to the network interface port.

Figure 7:
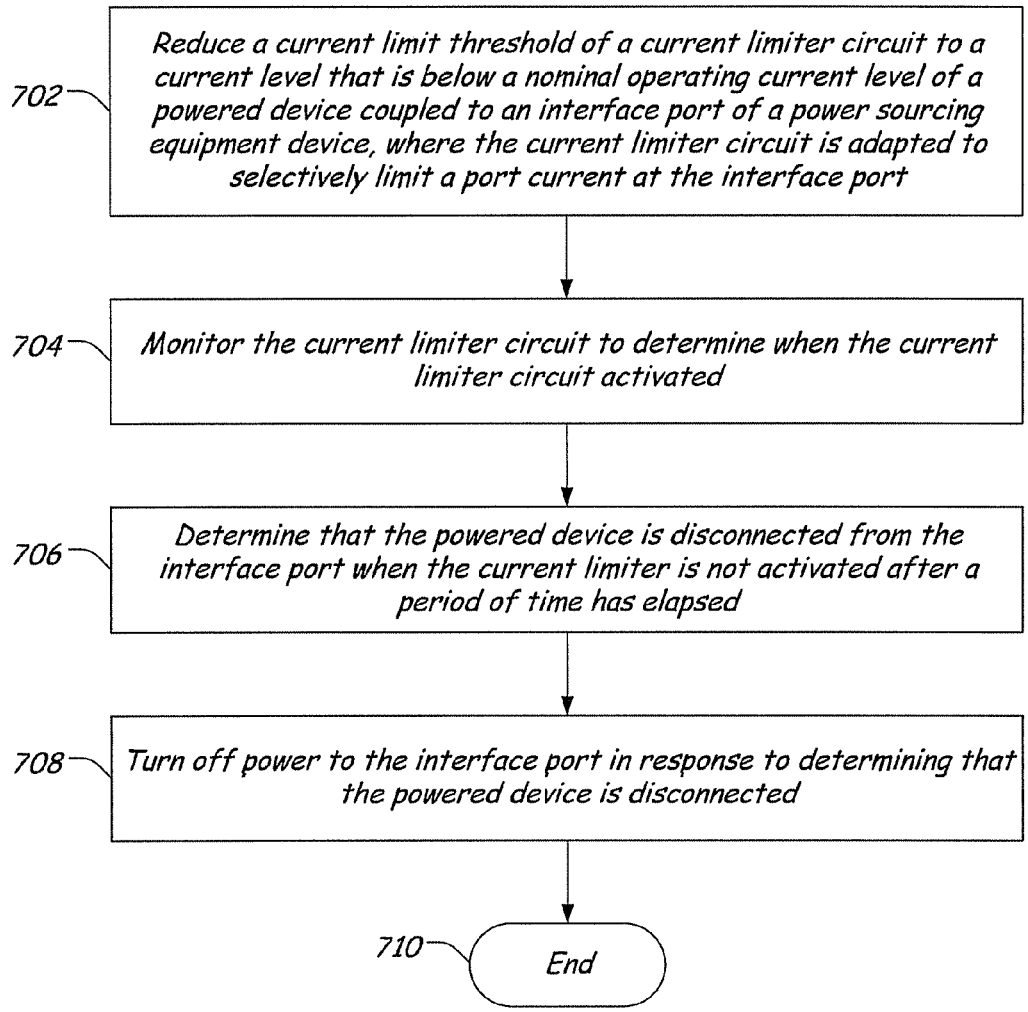
FIG. 7 is a flow diagram of a particular illustrative embodiment of a method of current limit-based disconnect detection.

FIG. 7 is a flow diagram of a particular illustrative embodiment of a method of detecting disconnection of a powered device. At 702, a current limit threshold of a current limiter circuit is reduced to a current level that is below a nominal operating current level of a powered device coupled to an interface port of a power sourcing equipment device, where the current limiter circuit is adapted to selectively limit a port current at the interface port. In a particular embodiment, reducing the current limit threshold includes reducing a reference current across a sense resistor. In another particular embodiment, reducing the current limit threshold includes increasing an effective resistance of a port sense resistor. In a third particular embodiment, reducing the current limit threshold includes reducing current through a reference transistor. In a fourth particular embodiment, reducing the current limit threshold includes decreasing the effective size of a port switch transistor. In a particular example, the port sense resistor is a circuit that includes a plurality of sense resistors coupled between a voltage source and a respective plurality of sense switches, where each of the respective plurality of sense switches comprising a first terminal coupled to the interface port, a control terminal responsive to a logic circuit, and a second terminal coupled to a particular sense resistor of the plurality of sense resistors. In this example, the effective resistance of the port sense resistor circuit can be increased by selectively deactivating one or more of the respective plurality of sense switches to disconnect selected sense resistors from the plurality of sense resistors to increase the effective resistance. Those skilled in the art will recognize that a switched transistor itself has an internal series resistance, therefore allowing the array of switched resistors to also be an approximation of an array of switches.

Advancing to 704, the current limiter circuit is monitored to determine when the current limiter circuit activated. In a particular embodiment, the current limiter circuit can be monitored by a powered device (PD) disconnect detection circuit, a power sourcing equipment (PSE) control logic circuit, another circuit, or any combination thereof. Continuing to 708, the powered device is determined to be disconnected from the interface port when the current limiter is not activated after a period of time has elapsed. In a particular example, the period of time is approximately three hundred milliseconds or less. Proceeding to 710, power is turned off to the interface port in response to determining that the powered device is disconnected. The method terminates at 712.

In a particular embodiment, the method includes determining that the powered device is connected to the interface port when the current limiter circuit is activated and adjusting the current limit threshold to a level that is at or above an operating current level associated with the powered device in response to detecting activation of the current limiter circuit. In a particular embodiment, the PD disconnect detection circuit, the PSE control logic circuit, another circuit, or any combination thereof can be used to detect activation of the current limiter circuit and to make decisions regarding a state of the PD relative to the interface port based on the state of the current limiter circuit.

Figure 8:
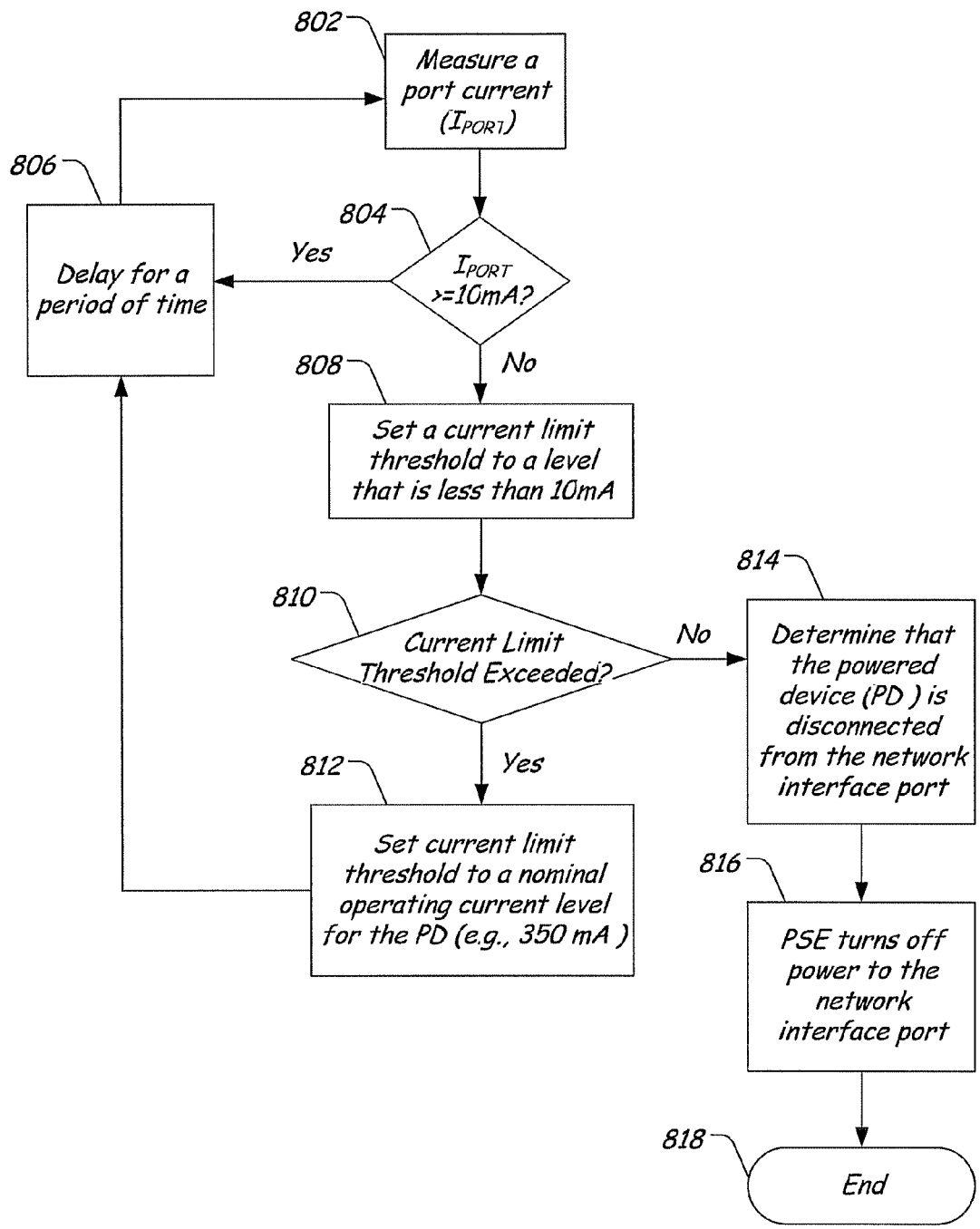
FIG. 8 is a flow diagram of a second particular illustrative embodiment of a method of current limit-based disconnect detection.

FIG. 8 is a flow diagram of a second particular illustrative embodiment of a method of detecting disconnection of a powered device. At 802, a port current ($I_{PORT}$) is measured, for example using an analog-to-digital converter (not shown). In an alternative embodiment, a current limiter threshold can be set to a level that is a few milliamps below a nominal operating current threshold to detect whether the PD is still drawing an operating current. Alternatively, the current limiter threshold can be set to 10 mA to detect whether the PD is drawing at least 10 mA based on whether the current limiter circuit is activated. Advancing to 804, the measured port current ($I_{PORT}$) is compared to a first threshold (such as 10 mA). At 804, if the measured port current ($I_{PORT}$) is greater than or equal to the first threshold, the method proceeds to 806 and the circuit waits for a period of time before returning to 802 and measuring the port current. In a particular embodiment, the period of time (or delay) can be longer than a disconnect detection period. In a particular example, the period of time can be one minute, 30 seconds, 400 milliseconds, or another time period.

Returning to 804, if the port current ($I_{PORT}$) is less than 10 mA, the method advances to 808 and a current limit threshold of an adjustable current limiter circuit is set to a level that is less than 10 mA. In a particular embodiment, the current limit threshold is set to a current level of approximately 7.5 mA. In another particular embodiment, the current limit threshold is set to a current level of approximately 5 mA. Advancing to 810, if the current limit threshold is exceeded by the port current ($I_{PORT}$), the method advances to 812 and the current limit threshold is set to a nominal operating current level for the PD. In a particular example, the nominal operating current level can be approximately 425 mA. The method advances to 806, and the circuit delays for a period of time before returning to 802 and measuring the port current ($I_{PORT}$).

Returning to 810, if the current limit threshold is not exceeded, the method continues to 814 and the PD disconnect detection logic determines that the powered device (PD) is disconnected from the network interface port. Proceeding to 816, the PSE turns off power to the network interface port. The method terminates at 818.

In a particular embodiment, the PSE control logic may utilize PD power supply data stored in a data log to make determinations regarding whether to turn off power to the PD. In still another particular embodiment, the PSE control logic may reduce the current limit threshold to a third level that is below 5 mA to see if the PD is drawing a very low current, before turning off power to the network interface port.

In general, it should be understood that the methods described with respect to FIGS. 7 and 8 are illustrative only, and are not intended to be limiting. Further, though the above-discussion has largely focused on a Power over Ethernet implementation, it should be understood that such techniques and circuits for detecting disconnection of a device from a port of the circuit can be used with other systems. In a particular example, the current limit-based disconnection detection can be used in power over broadband and other power/data systems and can be used with portable devices to monitor peripheral device connections, for example. Further, while the PoE Standard and the revised PoE Standard (the PoE Plus Standard) are discussed, it is contemplated that such standards are frequently revised and that the current levels indicating when a device is connected or disconnected may vary according to the standards. The adjustable current limiter circuit described above with respect to FIGS. 1-7 can be used to perform port current limit-based device detection at almost any current level, providing flexibility so that the circuit device can be used with new and emerging standards as well as existing standards.

In conjunction with the circuit devices, the systems and methods described above with respect to FIGS. 1-8, an analog current limiter circuit is disclosed that is adjustable to a current limit threshold that is below a nominal operating current level to detect whether a powered device (PD) is coupled to the network interface port. In a particular example, the current limiter circuit can be adjusted by changing a reference current or by selectively activating or deactivating an array of sense resistors. In a particular embodiment, a current threshold of the current limiter circuit is reduced to a level that is between a minimum current level specified by the PoE Standard and a disconnect current level. If the current limiter circuit is activated after reducing the current threshold, a PD can be determined to be connected to the network interface port. Otherwise, after a period of time, such as 400 milliseconds, 300 milliseconds, or some other time period, during which the current limiter circuit is not activated to limit the port current, the PD disconnect detect logic can determined that the PD has been disconnected and the PSE control circuit can turn off power to the network interface port.

By utilizing an analog current limiter circuit, any circuit pulse (even pulses of very short duration that may not have been detected using an analog-to-digital converter) can trigger the current limiter circuit to shut off the port current, shut off can be detected as a transient signal at the network interface port. Such a transient signal can be used to detect the presence of the PD based on short current pulses. The PSE device can continue to supply power to a PD that uses intermittent current draws for its operating power supply. Further, while the above-discussion has been largely directed to sense resistors or sense-resistor arrays, it should be understood that other types of sense elements, such as field effect transistor (FET) resistances, transistor arrays, other sense elements, or any combination thereof can be used to sense a circuit parameter, such as current or voltage.

Although the present invention has been described with reference to preferred embodiments, workers skilled in the art will recognize that changes may be made in form and detail without departing from the spirit and scope of the invention.

What is claimed is:

1. A power sourcing equipment (PSE) device comprising:
at least one network port adapted to couple to a powered device to provide power and optionally data to the powered device via a network cable;
a current limiter circuit coupled to the at least one network port and having an adjustable threshold; and
a logic circuit coupled to the current limiter circuit and adapted to:
reduce the adjustable threshold of the current limiter circuit to a threshold level that is below a nominal operating current level by selectively adjusting an effective resistance of a sense resistor coupled between the at least one network port and a power supply;
after a period of time has elapsed during which the current limiter circuit is not activated, the logic circuit is adapted to determine that the powered device is disconnected from the at least one network port.

2. The PSE device of claim 1, wherein the logic circuit is further adapted to:
detect when the current limiter circuit is activated to limit a port current; and
increase the adjustable threshold to an operating current level associated with the powered device in response to detecting activation of the current limiter circuit.

3. The PSE device of claim 1, wherein the logic circuit is adapted to reduce the adjustable threshold periodically to determine whether the powered device is coupled to the at least one network port.

4. The PSE device of claim 1, wherein the logic circuit is adapted to monitor a port current associated with the at least one network port and to reduce the adjustable threshold when the port current falls below a first current threshold.

5. The PSE device of claim 1, wherein the current limiter circuit comprises:
a voltage source;
a first sense element coupled to the voltage source and responsive to a reference current to produce a reference voltage;
a second sense element coupled to the voltage source and responsive to a port current to produce a sense voltage;
a comparator circuit to compare the reference voltage and the sense voltage and to produce a control signal related to a result of the comparison; and
a port switch including a first terminal coupled to a network port to receive the port current, a control terminal responsive to the control signal, and a second terminal coupled to the second sense element;
wherein the control signal controls the port switch to limit the port current when the sense voltage is greater than the reference voltage.

6. The PSE device of claim 5, wherein the logic circuit monitors the control signal to detect when the port switch is activated to limit the port current.

7. The PSE device of claim 5, wherein the adjustable threshold is further adjusted by changing the reference current.

8. The PSE device of claim 5, wherein the logic circuit monitors a voltage at the at least one network port to detect when the port switch is activated.

9. The PSE device of claim 5, wherein the second sense element comprises:
 a plurality of sense elements, each sense element includes a first terminal coupled to the voltage source and a second terminal; and
 a respective plurality of sense element switches, each sense element switch includes a first sense terminal coupled to the first of the port switch, a sense control terminal coupled to the logic circuit, and a second sense terminal coupled to the second terminal of a respective sense element of the plurality of sense elements;
 wherein the logic circuit is adapted to independently activate one or more of the respective plurality of sense element switches to couple the respective sense elements of the plurality of sense elements between the second terminal of the port switch and the voltage source in parallel to adjust the aggregate sense element.

10. A method comprising:
 reducing a current limit threshold of a current limiter circuit to a current level that is below a nominal operating current level of a powered device coupled to an interface port of a power sourcing equipment device, the current limiter circuit adapted to selectively limit a port current at the interface port, wherein the current limit threshold is reduced by altering an effective resistance of a sense resistor coupled between the interface port and a power supply;
 monitoring the current limiter circuit to determine when the current limiter circuit activated;
 determining that the powered device is disconnected from the interface port when the current limiter is not activated after a period of time has elapsed; and
 turning off power to the interface port in response to determining that the powered device is disconnected.

11. The method of claim 10, further comprising:
 determining that the powered device is connected to the interface port when the current limiter circuit is activated; and
 adjusting the current limit threshold to an operating current level associated with the powered device in response to detecting activation of the current limiter circuit.

12. The method of claim 10, wherein reducing the current limit threshold further comprises reducing a reference current across the sense resistor.

13. The method of claim 10, wherein the port sense resistor comprises a port sense resistor circuit including a plurality of sense resistors coupled between a voltage source and a respective plurality of sense switches, each of the respective plurality of sense switches comprising a first terminal coupled to the interface port, a control terminal responsive to a logic circuit, and a second terminal coupled to a particular sense resistor of the plurality of sense resistors.

14. The method of claim 13, wherein increasing the effective resistance of a port sense resistor circuit comprises selectively deactivating one or more of the respective plurality of sense switches to disconnect selected sense resistors from the plurality of sense resistors to increase the effective resistance.

15. The method of claim 10, wherein the period of time comprises approximately three hundred milliseconds or less.

16. A circuit device comprising:
 at least one network port adapted to couple to a powered device to provide power and optionally data to the powered device via a network cable;
 a sense resistor coupled between the at least one network port and a power supply;
 a current limiter circuit coupled to the at least one network port, the current limiter circuit having an adjustable threshold; and
 a logic circuit coupled to the current limiter circuit and adapted to:
  change the adjustable threshold to a reduced threshold level that is below a nominal operating threshold by altering an effective resistance of the sense resistor;
  detect activation of the current limiter circuit to limit a port current to the at least one network port when the powered device is connected to the at least one network port;
  reset the adjustable threshold to a level that is greater than or equal to the nominal operating threshold when activation of the current limiter circuit is detected.

17. The circuit device of claim 16, wherein the logic circuit is adapted to detect that the powered device is disconnected from the at least one network port when the current limiter circuit is not activated for a period of time.

18. The circuit device of claim 17, wherein the logic circuit is adapted to turn off power to the at least one network port when the powered device is disconnected.

19. The circuit device of claim 16, further comprising a power injector responsive to the logic circuit to apply power to at least two pairs of cables of a twisted-pair network cable.

20. The circuit device of claim 16, wherein the logic circuit is adapted to change the adjustable threshold periodically.

21. The circuit device of claim 16, wherein the logic circuit is adapted to:
 monitor the port current; and
 change the adjustable threshold in response to detecting when the port current falls below a first port threshold without disconnecting the powered device.

* * * * *